United States Patent [19]

Dasai et al.

[11] Patent Number: 4,754,171
[45] Date of Patent: Jun. 28, 1988

[54] HIGH SPEED LOW POWER EMITTER COUPLED LOGIC CIRCUIT

[75] Inventors: Teiji Dasai; Yoshimasa Hiki, both of Tokyo, Japan

[73] Assignee: NEC Corporation, Tokyo, Japan

[21] Appl. No.: 922,502

[22] Filed: Oct. 23, 1986

[30] Foreign Application Priority Data

Oct. 23, 1985 [JP] Japan ............................... 60-237968
Dec. 25, 1985 [JP] Japan ............................... 60-294275
Dec. 25, 1985 [JP] Japan ............................... 60-294286

[51] Int. Cl.$^4$ ...................... H03K 19/13; H03K 19/20
[52] U.S. Cl. ..................................... 307/455; 307/291
[58] Field of Search ................................ 307/455, 291

[56] References Cited

U.S. PATENT DOCUMENTS 4,276,485  6/1981  Rydval ................................. 307/463
4,614,885  9/1986  Brosch et al. ........................ 307/513

FOREIGN PATENT DOCUMENTS 0071326  5/1980  Japan .

Primary Examiner—Stanley D. Miller
Assistant Examiner—Richard Roseen
Attorney, Agent, or Firm—Sughrue, Mion, Zinn, Macpeak, and Seas

[57] ABSTRACT

A current-mode logic circuit includes a pair of input bipolar transistors coupled in the emitter-coupled single differential circuit configuration, one of which input transistors is connected at its base to receive an input signal and the other input transistor is connected at its base to receive a reference voltage. The collector of each of the input transistors is connected to a base of an emitter-follower driver which is in turn connected at its collector to a voltage supply terminal and at its emitter through load means to another voltage supply terminal. The emitters of these output transistors are connected to a pair of output terminals to generate a pair of complementary logic signals. Further, there are provided first and second auxiliary transistors connected in the cross-coupled flip-flop configuration and connected at their collectors to the emitters of the first and second output bipolar transistors, respectively.

9 Claims, 4 Drawing Sheets

HIGH SPEED LOW POWER EMITTER COUPLED LOGIC CIRCUIT

BACKGROUND OF THE INVENTION

1. Field of the Invention

The present invention relates generally to electronic logic circuits, and more particularly to a current-mode logic circuit capable of operating at a high speed and with low power consumption.

2. Description of Related Art

Advancements in the technology of digital computers are coming at the system level via improvement of programming techniques and at the hardware level through improved circuit technology. The logic circuits employed in digital computers may be either voltage-mode or current-mode. Heretofore, the voltage-mode logic such as diode-transistor logic and transistor-transistor logic has been predominant. In the voltage-mode logic, the voltage level of a signal imports determines the content. However, the voltage-mode logic has the inherent delay attendant with transistor saturation, and therefore, has no longer fulfilled the increasing speed requirement of modern digital computers.

Current-mode logic, wherein a logic signal is transmitted through currents, overcomes some of the limitation of the voltage-mode logic. For example, fewer circuit elements and less supply power are required than for the voltage-mode logic. More importantly, increased circuit speed can be obtained in comparison with the voltage-mode logic.

Typically, the current-mode logic includes an emitter-coupled single differential circuit as the primary switch, and an emitter-follower driver is often associated to each output of the differential circuit for driving a succeeding logic gate. Ordinarily, this emitter-follower driver is so very simply constructed with a single transistor connected at its base to a corresponding output of the emitter-coupled single differential circuit and at its emitter to an input of a succeeding logic and also to a voltage supply terminal through a resistor. With this arrangement, a voltage signal appearing across the emitter resistor is supplied to the succeeding logic circuit.

On the other hand, the circuit inevitably has a parasitic capacitive load which includes a wiring capacitance between the output of the emitter-follower and the input of the succeeding logic gate and an input capacitance of the succeeding logic gate. This parasitic capacitive load is charged and discharged every time the emitter-follower transistor is turned on and off. Particularly, when the emitter-follower transistor is turned off, the voltage across the emitter resistor changes with a time constant determined by the resistance of the emitter resistor itself and the capacitance of the parasitic capacitive load. This means that if the parasitic capacitive load is relatively large, the voltage across the emitter resistor will not sharply fall down. Namely, the circuit has a substantial delay time, which is a hindrance in speed-up of the logic circuit.

In order to achieve the speed-up in this circuit structure, one might consider decreasing the resistance of the emitter resistor to decrease the time constant in question. However, the decrease of the emitter-resistance leads to an increase of consumed power of the emitter-follower driver. In addition, the increased power consumption of the circuit will decrease the integration density when it is assembled in integrated circuits.

SUMMARY OF THE INVENTION

Accordingly, it is an object of the present invention to provide a logic circuit capable of generating a sharply falling output logic signal.

Another object of the present invention is to provide a logic circuit capable of operating at a high speed and with low power consumption.

Still another object of the present invention is to provide a logic circuit including an emitter-coupled current-mode logic and associated emitter-follower drivers, which circuit can generate a logic output signal sharply falling down even if it is associated with a large capacitive load, and which circuit can operate with lower power consumption.

A further object of the present invention is to provide a logic circuit having a small propagation delay time.

A still further object of the present invention is to provide a high-speed, low-power-consumption, logic circuit which can be assembled in an integrated circuit with a high integration density.

The above and other objects of the present invention are achieved in accordance with the present invention by a logic circuit having at least one input terminal and at least one output terminal, which circuit includes a logic stage having at least one input connected to the input terminal and a pair of outputs generating a pair of complementary output signals in response to a signal applied to the input, and an output stage having first and second output transistors connected at their inputs to the outputs of the logic stage, respectively, each of the first and second output transistors having one output, the output of one of the first and second output transistors being connected to the output terminal, comprising first and second auxiliary transistors connected in the cross-coupled flip-flop configuration and having a pair of output nodes connected to the outputs of the first and second output transistors, respectively.

Specifically, the first and second output transistors are, respectively, bipolar transistors connected at their collectors in common to a first voltage supply terminal and at their bases to the outputs of the logic stage, respectively. One of the first and second output bipolar transistors is connected at its emitter to the output terminal. Further, the first and second auxiliary transistors are also, respectively, bipolar transistors whose collectors are connected to the emitters of the first and second output bipolar transistors, respectively. The base of each of the first and second auxiliary transistors is cross-connected to the collector of the other auxiliary transistors, and the emitter of each auxiliary transistor is connected through resistive means to a second voltage supply terminal.

In one embodiment, the emitters of the first and second auxiliary bipolar transistors are connected to the second voltage supply terminal through a pair of independent resistors, respectively.

In another embodiment, the emitters of the first and second auxiliary bipolar transistors are connected in common to one end of a resistor whose other end is connected to the second voltage supply terminal.

In a third embodiment, the base of each of the first and second auxiliary transistors is cross-connected to the collector of the other auxiliary transistor through a capacitor and also connected to the second voltage supply terminal through a resistor. In this embodiment, the emitters of the first and second auxiliary bipolar transistors can be connected in common to one end of a resistor whose other end is connected to the second voltage supply terminal.

In a preferred embodiment, the logic stage includes a pair of input bipolar transistors connected in the emitter-coupled single differential circuit configuration, one of the input transistors being connected at its base to the input of the logic stage, the other input transistor being connected at its base to a reference voltage. The collectors of these input transistors are connected to the complementary outputs of the logic stage, respectively. Further, the common-coupled emitters of the input transistors are connected to a voltage supply terminal through a further bipolar transistor whose base is connected to a control voltage so that the further bipolar transistor acts as a constant current source.

In accordance with another aspect of the present invention, there is provided a current-mode logic circuit which includes a current-mode logic stage having a pair of input bipolar transistors coupled in the emitter-coupled single differential circuit configuration to have their common-connected emitters connected to a first voltage supply terminal through a constant current source, one of the input transistors being connected at its base to receive an input signal and at its collector through a resistor to a second voltage supply terminal, the other input transistor being connected at its base to receive a reference voltage and at its collector through a resistor to the second voltage supply terminal; and an emitter-follower driver having first and second output bipolar transistors connected at their bases to the collectors of the input transistors, respectively, and at their collectors to the second voltage supply terminal, the emitters of the output transistors being connected through load means to a third voltage supply terminal to generate a pair of complementary logic signals, respectively, the emitter of at least one of the output transistors being connected to at least one output terminal, comprising first and second auxiliary transistors connected in the cross-coupled flip-flop configuration and having a pair of output nodes connected to the emitters of the first and second output transistors, respectively.

Specifically, the first and second auxiliary bipolar transistors are connected at their collectors to the emitters of the first and second output bipolar transistors, respectively, and the base of each of the first and second auxilary transistors is cross-connected to the collector of the other auxiliary transistor. In a first embodiment, the emitters of the first and second auxiliary bipolar transistors are connected to the first voltage supply terminal through a pair of independent resistors, respectively. In a second embodiment, the emitters of the first and second auxiliary bipolar transistors are connected in common to one end of a resistor whose other end is connected to the first voltage supply terminal. In a third embodiment, the base of each of the first and second auxiliary transistors is cross-connected to the collector of the other auxiliary transistor through a capacitor and also connected to the first voltage supply terminal through a resistor. Further, the emitters of the first and second auxiliary bipolar transistors are connected in common to one end of a resistor whose other end is connected to the first voltage supply terminal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
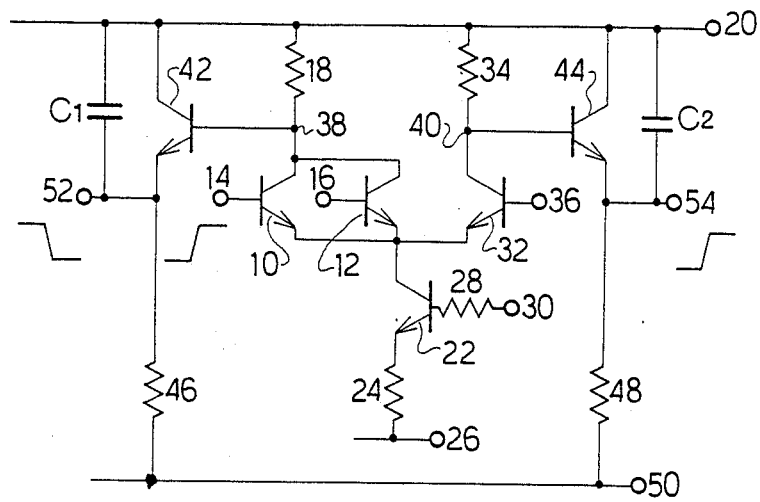
FIG. 1 is a circuit diagram of a conventional emitter-coupled current-mode logic circuit.

Referring to FIG. 1, there is shown a conventional emitter-coupled current-mode logic circuit which consitutes a two-input AND-NAND circuit in the negative logic. This shown circuit includes first and second bipolar transistors 10 and 12 connected in parallel to each other. The first transistor 10 is connected at its base to a first input 14 so as to receive a first logical signal, and the second transistor 12 is connected at its base to a second input 16 so as to receive a second logical signal. The common-connected collectors of these transistors 10 and 12 are connected through a resistor 18 to a first voltage supply terminal 20. The common-connected emitters of the transistors 10 and 12 are connected through a bipolar transistor 22 and a resistor 24 to a second voltage supply terminal 26. This transistor 22 is connected at its base through a resistor 28 to a current control terminal 30, so that the transistor 22 functions as a constant current source.

Further, a bipolar transistor 32 is connected to cooperate with each of the input transistors 10 and 12 so as to form a simple differential circuit. Namely, the emitter of the transistor 32 is connected to the emitters of the transistors 10 and 12, and the collector of the transistor 32 is connected through a resistor 34 to the first voltage supply terminal 20. Further, the base of the transistor 32 is connected to a reference voltage terminal 36.

The single differential circuit thus formed constitutes a current-mode logic stage, whose output nodes 38 and 40 generate a pair of complementary logic signals. These output nodes 38 and 40 are connected to respective bases of output bipolar transistors 42 and 44, which are in turn connected at their collectors to the first voltage supply terminal 20 and at their emitters through load resistors 46 and 48 to a third voltage supply terminal 50. Further, the emitters of the output transistors 42 and 44 are connected to a NAND output terminal 52 and an AND output terminal 54; respectively. Thus, each of the output transistors 42 and 44 constitutes an emitter-follower driver for the corresponding output of the differential circuit (i.e., the current-mode logic stage).

If the above mentioned logic circuit is connected at its output terminals to another logic circuit (not shown), each of the output terminals 52 and 54 will inevitably have a parasitic capacitive load including a wiring capacitance between the output of the emitter-follower and the input of the succeeding logic circuit and an input capacitance of the succeeding logic circuit. These parasitic capacitances are indicated by $C_1$ and $C_2$ in FIG. 1.

With this arrangement, if both the inputs 14 and 16 drop from a high potential to a low potential lower than that of the reference voltage terminal 36, the transistors 10 and 12 are turned off, so that the node 38 becomes a high potential and the node 40 becomes a low potential. Therefore, the emitter-follower 42 operates in such a manner that the voltage of the output terminal 52 rises up from a low level to a high level (which is smaller than the base potential of the output transistor 42 by the base-emitter voltage of the transistor 42). In this condition, since the transistor 42 is in an on condition, even if the capacitive load $C_1$ is large; the potential of the output terminal 52 quickly rises up. Namely, when the potential of the terminal 52 rises up, the circuit operates at a speed with no substantial delay time.

On the other hand, for example, if the input signal applied to the input terminal 14 rises from the low potential to a high potential (which is higher than that of the reference voltage terminal 36), the transistor 10 is turned on, so that the node 38 becomes a low potential and the node 40 becomes a high potential. As a result, the voltage appearing at the output terminal 52 falls down, and the voltage of the terminal 54 rises up. In this condition, the voltage difference across the resistor 46 is smaller than the voltage difference across the resistor 48, and so the current flowing through the resistor 46 is smaller than the current of the resistor 48. Therefore, the larger the capacitive load become, i.e., the larger the parasitic capacitance $C_1$ becomes, the capacitance $C_1$ needs a longer time for discharge. In other words, the potential of the output terminal 52 will change with the time constant determined by the resistance of the resistor 46 and the parasitic capacitance $C_1$. As a result, the voltage drop at the output terminal 52 will be substantially delayed from the voltage drop at the node 38. This is a hindrance to the high speed characteristic of the current-mode logic.

Specifically, since the voltage drop at the output terminal 52 is later than the voltage drop of the node 38, the base potential of the transistor 42 will become lower than the emitter potential once, so that the transistor 42 will be turned off. Thereafter, with decrease of the potential of the output terminal 52, i.e., the emitter potential of the transistor 42, the base potential of the transistor 42 becomes higher than the emitter potential again, and so the transistor 42 will returned to its on condition.

Therefore, when the potential of the terminal 52 drops, the circuit cannot have a sufficient operation speed. This problem occurs not only at the NAND output terminal 52 but also at the AND output terminal 54.

The above mentioned delay is attributable to the time constant determined by the resistor 46 (or 48) and the capacitive load $C_1$ (or $C_2$). Therefore, in order to decrease the time constant in question, one could decrease the resistance of the resistor 46 (and 48). However, if the resistance of the resistor 46 (and 48) is decreased, the emitter-follower driver will need a larger power consumption. In addition, if the power consumption is increased, the integration density cannot be increased.

Figure 2:
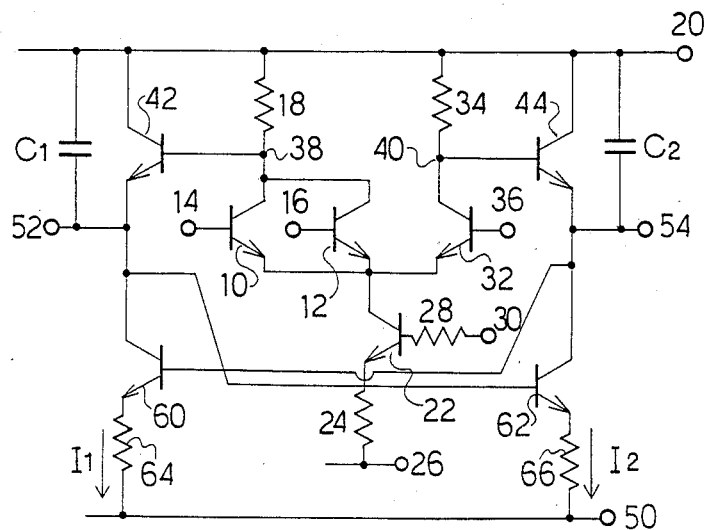
FIG. 2 is a diagram similar to FIG. 1 but showing a first embodiment of an emitter-coupled current-mode logic circuit in accordance with the present invention.

Turning to FIG. 2, there is shown a first embodiment of the emitter-coupled current-mode logic circuit in accordance with the present invention. In FIG. 2, elements similar to those shown in FIG. 1 are given the same reference numerals, and explanation thereof will be omitted.

As will be apparent from comparison between FIGS. 1 and 2, the circuit shown in FIG. 2 comprises a pair of auxiliary bipolar transistors 60 and 62 connected in such a cross-coupled flip-flop configuration that the base of each of the auxiliary transistors 60 and 62 is connected to the collector of the other auxiliary transistor. One of the auxiliary transistors 60 is connected at its collector to the emitter of the output transistor 42 (i.e., the output terminal 52) and at its emitter through a resistor 64 to the voltage supply terminal 50. The other auxiliary transistor 62 is connected at its collector to the emitter of the output transistor 44 (i.e., the output terminal 54) and at its emitter through a resistor 66 to the voltage supply terminal 50. These resistors 64 and 66 have a resistance smaller than that of the resistors 46 and 48 in the circuit shown in FIG. 1.

With the circuit shown in FIG. 2, assuming that both the input terminals 14 and 16 are at a low potential, the transistor 32 is in an on condition, and so the node 40 is at a low potential and the node 38 is at a high potential. Therefore, since the potential of the NAND output terminal 52 is higher than that of the AND output terminal 54, the auxiliary transistor 62 is put in an on condition, and the auxiliary transistor 60 is brought into an off condition. Thus, a load connected to the output terminal 52 is rapidly charged by cooperation of the transistor 42 in the on condition and the transistor 60 in the off condition, and therefore, the voltage of the terminal 52 rises up sharply. In this condition, the two emitter-follower drivers take the following current relation:

$$I_1 < I_2$$

where $I_1$ is the current flowing through the resistor 64, and $I_2$ is the current following through the resistor 66.

Therefore, the emitter-follower current at a low potential output side is larger than that of the emitter-follower at a high potential side.

Figure 3:
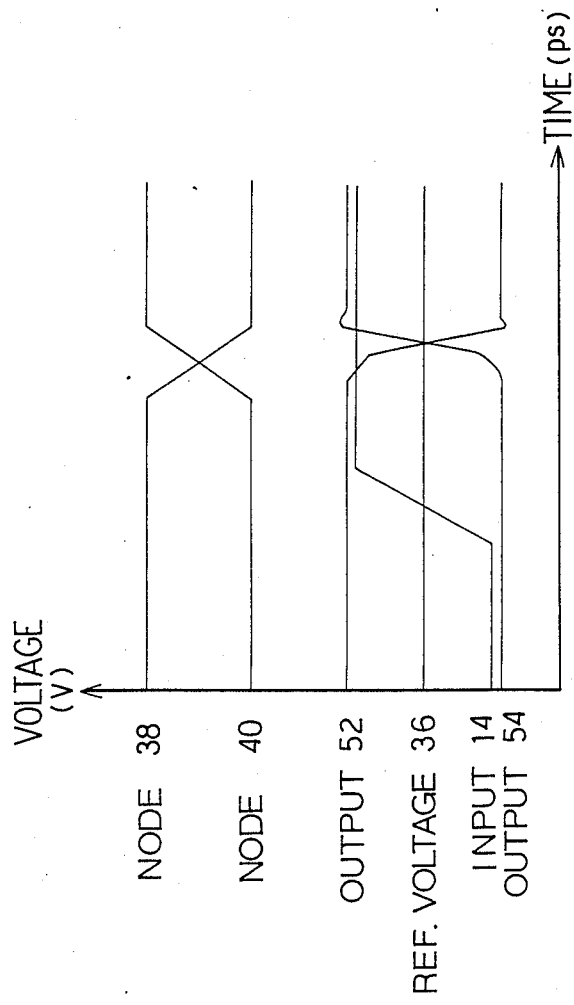
FIG. 3 illustrates the waveforms at various points of the circuit shown in FIG. 2.

When the input signal at the input 14 rises up from a low potential to a high potential which is higher than the reference potential at the terminal 36, as shown in FIG. 3, the transistor 10 is turned on and the transistor 32 is turned off. Therefore, the node 38 changes from a high level to a lower level, and the node 40 changes from a low level to a high level, as also shown in FIG. 3. As a result, the output terminal 52 drops from a high potential to a low potential through the transistor 42 with discharge of the capacitance $C_1$. On the other hand, the output terminal 54 rises from a low potential to a high potential through the transistor 44 with charging of the capacitor $C_2$. In this operation, the transistor 60 is brought into an on condition and the transistor 62 is put in an off condition.

In this case, if the capacitance $C_1$ has a substantial value, the discharge time of the capacitance $C_1$ depends upon the emitter-follower current $I_1$ at a low potential output side. In the prior art circuit shown in FIG. 1, since the emitter-follower current at a low potential output side is smaller than the emitter-follower current at a high potential output side, the discharge of the capacitance takes a substantial time. However, in the circuit shown in FIG. 2, because of the cross-coupled auxiliary transistors 60 and 62 and the low resistance of resistors 64 and 66, the emitter-follower current $I_1$ at a low potential output side (transistor 42) is higher than the emitter-follower current $I_2$ at a high potential output side (transistor 44), and therefore, the capacitance $C_1$ rapidly discharges, with the result that the voltage at the output terminal 52 drops with a very short falling time as shown in FIG. 3.

In the circuit shown in FIG. 2, when the emitter-follower transistor is put in a high potential output condition, the current flowing through the emitter-follower transistor is limited by the auxiliary transistor which is connected in series to the emitter-follower transistor and which is put in an off condition. On the other hand, when the emitter-follower transistor is put in a low potential output condition, the current of the emitter-follower transistor is limited by the emitter-follower transistor itself which is put in off condition in an accordance with the base biasing. Therefore, the output or driver circuit composed of a pair of emitter-followers shown in FIG. 2 can decrease the power consumption.

Figure 4:
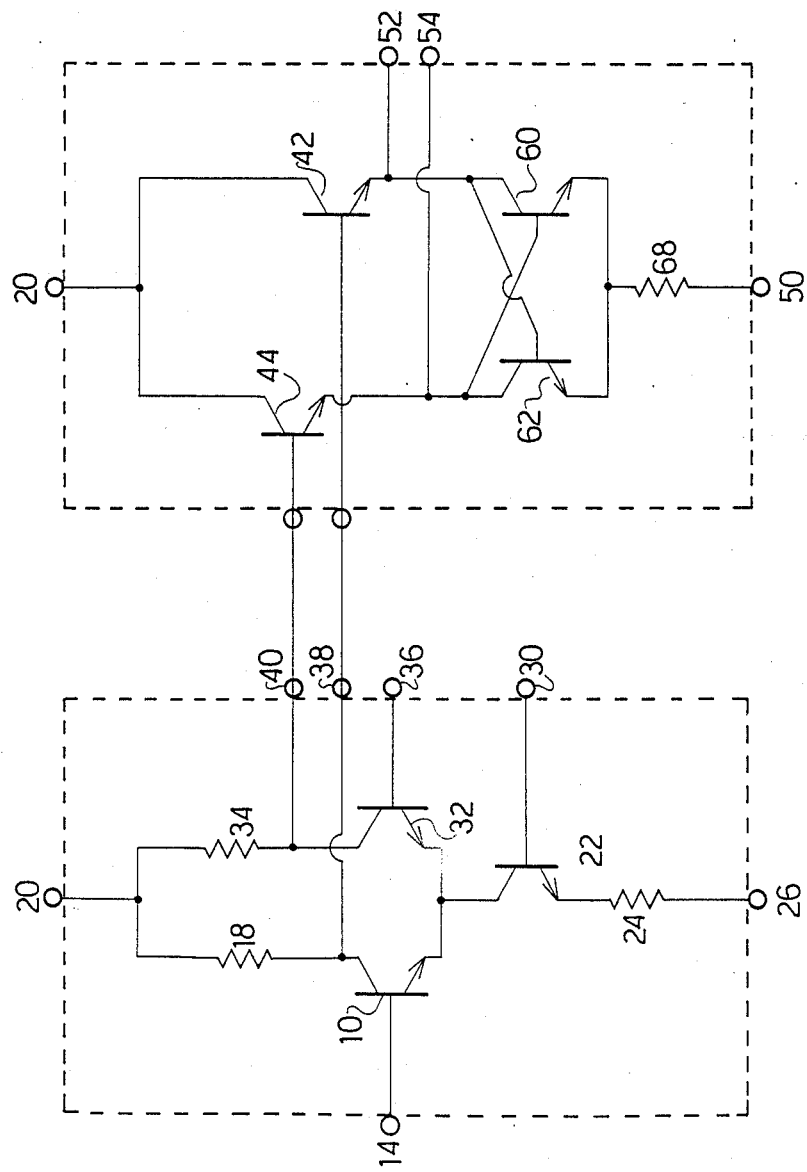
FIG. 4 is a circuit diagram of a second embodiment of the emitter-coupled current-mode logic circuit in accordance with the present invention.

Referring to FIG. 4, there is shown a second embodiment of the emitter-coupled current mode logic circuit. Elements similar to those shown in FIG. 2 are given the same reference numerals.

Comparing the circuit of FIG. 4 with the circuit of FIG. 2, the circuit of FIG. 4 includes only one signal input transistor 10, and the emitters of auxiliary transistors 60 and 62 are connected to each other and are connected through a common resistor 68 to the voltage supply terminal 50. However, the circuit operates similarly to the circuit of FIG. 2, except for the following point.

Namely, if the circuit is supplied with the same electric power as that of the conventional circuit shown in FIG. 1, the current flowing through the resistor 68 can be made twice the current flowing through the resistor 46 or 48. Further, the output or drive stage consisting of the pair of emitter-follows 42 and 44 is of the constant current type. Therefore, the operation speed of the output or drive stage can be doubled in comparison with the conventional circuit. On the other hand, if the drive stage shown in FIG. 4 is allowed to have the same delay time of the conventional driver circuit, the current flowing through the resistor 68 can be made the same as that flowing through the resistor 46 or 48, and so the power consumption can be made a half of that of the conventional circuit.

As mentioned above, the circuit of FIG. 4 can obtain not only the advantages obtained in the circuit of FIG. 2 but also the above advantage.

Figure 5:
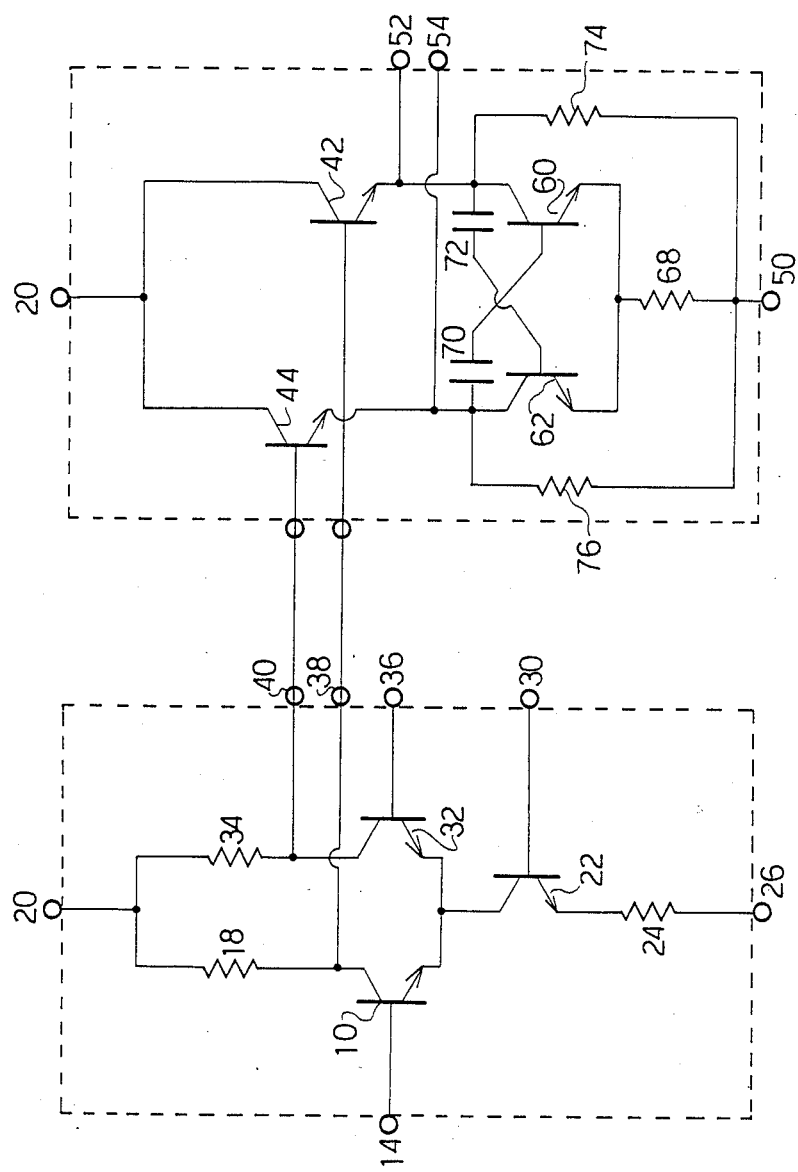
FIG. 5 is a diagram similar to FIG. 4 but showing a third embodiment of the emitter-coupled current-mode logic circuit in accordance with the present invention.

Turning to FIG. 5, there is shown a modification of the circuit shown in FIG. 4. Therefore, elements similar to those shown in FIG. 4 are given the same reference numerals, and explanation thereof will be omitted. The circuit of FIG. 5 is different from the circuit of FIG. 4 in that the bases of the auxiliary transistors 60 and 62 are cross-connected through capacitors 70 and 72 to the collector of the other auxiliary transistor, and the emitters of the output transistors 42 and 44 are connected to the voltage supply terminal 50 through resistors 74 and 76, respectively.

The circuit of FIG. 5 operates in a manner similar to that of the FIG. 4. However, the load connected to the output terminal 52 is discharged partially through the resistor 74 and partially through the series circuit of the transistor 60 in the on condition and the resistor 68. Therefore, if the resistance of the resistors 74 and 76 is sufficiently large, and the resistance of the resistor 68 is sufficiently small, a large portion of the charge will be quickly discharged through the transistor 60 and the resistor 68. In addition, the resistors 74 and 76 can be set at a sufficiently high value to settle the potential of the output terminals 52 and 54 at a desired high level.

As can be seen from the above, the auxiliary transistors 60 and 62 are turned on through the base capacitors 70 and 72, respectively. Therefore, the capacitance of the capacitors 70 and 72 determines the duration of the on condition of the respective transistors 60 and 62, and so is preferably selected at a minimum value to enable to quickly and sufficiently discharge of the charge of the load connected to the output terminal. Thus, unless the logic signal of the input 14 changes, since the auxiliary transistors 60 and 62 are maintained in an off condition, the current flowing in the driver stage is limited to a small value by the resistors 74 and 76. Thus, a very small-power-consumption driver stage can be obtained.

The above mentioned embodiments of the present invention are an AND-NAND circuit, and a one-input OR-NOT circuit (buffer gate-inverter). However, the present invention can be equally applied to other logic circuits having complementary outputs, such as OR-NOR circuits and ExOR-ExNOR circuits. Further, the above embodiments have a pair of complementary output terminals but, the embodiment of FIG. 2 can be modified to an AND circuit or a NAND circuit by omitting one of the output terminals, and the embodiments of FIGS. 4 and 5 can also be modified to a buffer gate or an inverter by omitting one of the output terminals. Therefore, the present invention can be applied to other single logic gages such as an OR gate, NOR gate, ExOR gate, and ExNOR gate.

The invention has thus been shown and described with reference to specific embodiments. However, it should be noted that the invention is in no way limited to the details of the illustrated structures but changes and modifications may be made within the scope of the appended claims.

We claim:

1. A logic circuit having at least one input terminal and at least one output terminal, comprising:
    a logic stage having at least one input connected to said input terminal and a pair of outputs generating a pair of complementary output signals in response to a signal applied to said input;
    an output stage having first and second output bipolar transistors each having an emitter, base and collector, said first and second output bipolar transistors having their collectors connected in common to a first voltage supply terminal and having their bases connected to respective ones of said pair of outputs of the logic stage, one of the first and second output bipolar transistors having its emitter connected to said output terminal; and
    first and second auxiliary bipolar transistors each having an emitter, base and collector, the collectors of said first and second auxiliary bipolar transistors being connected to emitters of the first and second output bipolar transistors, respectively, the collector of each of the first and second auxiliary bipolar transistors being connected to the base of the other of the first and second auxiliary bipolar transistors through a capacitor and also connected to a second voltage supply terminal through a resistor, an emitter of each auxiliary bipolar transistor being connected through resistive means to said second voltage supply terminal.

2. A logic circuit having at least one input terminal and at least one output terminal, comprising:

a logic stage having at least one input connected to said input terminal and a pair of outputs generating a pair of complementary output signals in response to a signal applied to said input, said logic stage including a pair of input bipolar transistors each having an emitter, base and collector and connected in an emitter-coupled single differential circuit configuration with one of said pair of input transistors being connected at its base to the input of the logic stage and the other of said pair of input transistors being connected at its base to a reference voltage, collectors of said pair of input transistors being connected to respective ones of said pair of outputs of the logic stage, emitters of said input transistors being connected to a first voltage supply terminal through a common bipolar transistor whose base is connected to receive a control voltage so as to function as a constant current source;

an output stage having first and second output bipolar transistors each having an emitter, base and collector, said first and second output bipolar transistors having their collectors connected in common to a second voltage supply terminal and having their bases connected to respective outputs of the logic stage, one of the first and second output bipolar transistors being connected at its emitter to said output terminal; and first and second auxiliary bipolar transistors each having an emitter, base and collector, said first and second auxiliary bipolar transistors having their collectors connected to respective emitters of the first and second output bipolar transistors, the collector of each of the first and second axiliary bipolar transistors being connected to the base of the other of the first and second auxiliary transistors through a capacitor and also connected to a third voltage supply terminal through a resistor, an emitter of each of said first and second auxiliary bipolar transistors being connected through resistive means to said third voltage supply terminal.

3. A current-mode logic circuit which includes a current-mode logic stage comprising:

a pair of input bipolar transistors each having an emitter, base and collector, said pair of input bipolar transistors being coupled in an emitter-coupled single differential circuit configuration with their emitters connected in common to a first voltage supply terminal through a constant current source, one of said pair of input transistors being connected at its base to receive an input signal and at its collector through a resistor to a second voltage supply terminal, the other of said pair of input transistors being connected at its base to receive a reference voltage and at its collector through a resistor to the second voltage supply terminal;

an emitter-follower driver having first and second output bipolar transistors each having an emitter, base and collector, said first and second output bipolar transistors being connected at their bases to the collectors of respective ones of said pair of input bipolar transistors, and being connected at their collectors to said second voltage supply terminal, emitters of said first and second output bipolar transistors being connected through respective load means to a third voltage supply terminal to generate a pair of complementary logic signals, the emitter of at least one of said first and second output bipolar transistors being connected to at least one output terminal; and first and second auxiliary bipolar transistors each having an emitter, base and collector, said first and second auxiliary bipolar transistors being connected in a cross-coupled flip-flop configuration with the collector of each of said first and second auxiliary bipolar transistors being connected to the emitter of a respective one of said first and second output bipolar transistors at a respective output node and the base of each of said first and second auxiliary bipolar transistors being connected to the output node at the collector of the other of said first and second auxiliary bipolar transistors through a capacitor and each output node further being connected to a third voltage supply terminal through a resistor, and emitters of said first and second auxiliary bipolar transistors being connected to said third voltage supply terminal through resistive means.

4. An AND-NAND circuit in negative logic, comprising:

at least two input terminals;

a reference voltage terminal;

at least two input transistors each having an emitter, base and collector and each having its base connected to a corresponding one of said input terminals, collectors of said at least two input transistors being connected in common to one end of a first resistor whose other end is connected to a first voltage supply line, and said emitters of said at least two input transistors being connected in common;

a reference transistor having a base connected to said reference voltage terminal, an emitter connected in common with said emitters of said at least two input transistors and a collector connected to one end of a second resistor whose other end is connected to the first voltage supply line;

a current source connected to said emitters of said at least two input transistors and said reference transistor;

a first emitter follower transistor having a base connected to said one end of said first resistor and an emitter connected to a first output terminal;

a second emitter follower transistor having a base connected to said one end of said second resistor and an emitter connected to a second output terminal;

a flip-flop including first and second output transistors each having an emitter, base and collector, the collector of said first output transistor being electrically connected to the base of said second output transistor and said emitter of said first emitter follower transistor, and the collector of said second output transistor being electrically connected to the base of said first output transistor and said emitter of said second emitter follower transistor.

5. An AND-NAND circuit as claimed in claim 4, wherein the collector of each of the first and second output transistors is connected to a base of the other of said first and second output transistors through a capacitor and is also connected to a third voltage supply line through a resistor, and an emitter of each of said first and second output transistors is connected through resistive means to the third voltage supply line.

6. An AND-NAND circuit as claimed in claim 5, wherein the emitters of the first and second output transistors are connected in common to one end of a resistor whose other end is connected to the third voltage supply line.

7. A logic circuit as claimed in claim 1 wherein the emitters of the first and second auxiliary bipolar transistors are connected in common to one end of a resistor whose other end is connected to the second voltage supply terminal.

8. A logic circuit as claimed in claim 2 wherein the emitters of the first and second auxiliary bipolar transistors are connected in common to one end of a resistor whose other end is connected to the third voltage supply terminal.

9. A logic circuit as claimed in claim 3 wherein the emitters of the first and second auxiliary bipolar transistors are connected in common to one end of a resistor whose other end is connected to the third voltage supply terminal.

* * * * *